United States Patent
Monnot

[11] Patent Number: 6,100,710
[45] Date of Patent: Aug. 8, 2000

[54] SEMICONDUCTOR DEVICE HAVING TWO GROUND PADS CONNECTED TO A GROUND CONNECTION LEAD AND METHOD FOR TESTING THE SAME

[75] Inventor: Giles Monnot, Saint-Martin-d'Hères, France

[73] Assignee: STMicroelectronics S.A., Gentilly, France

[21] Appl. No.: 09/405,267

[22] Filed: Sep. 23, 1999

Related U.S. Application Data

[62] Division of application No. 09/163,045, Sep. 29, 1998, Pat. No. 5,986,345.

[30] Foreign Application Priority Data

Sep. 29, 1997 [FR] France ................................. 97 12066

[51] Int. Cl.$^7$ ................................................. G01R 31/26
[52] U.S. Cl. ............................................ 324/765; 324/537
[58] Field of Search ....................................... 324/537, 538, 324/765, 767; 438/14, 17

[56] References Cited

U.S. PATENT DOCUMENTS

| | | | |
|---|---|---|---|
| 4,779,041 | 10/1988 | Williamson, Jr. ........................ | 324/537 |
| 5,521,511 | 5/1996 | Lanzi et al. ............................. | 324/537 |

FOREIGN PATENT DOCUMENTS

| | | |
|---|---|---|
| 0 306 656 | 3/1989 | European Pat. Off. . |
| 0 622 733 A1 | 11/1994 | European Pat. Off. . |
| 2 061 617 | 5/1981 | United Kingdom . |

OTHER PUBLICATIONS

European Patent Abstract of Japanese Publication No. 63164353, published Jul. 7, 1988.
European Patent Abstract of Japanese Publication No. 01015949, published Jan. 19, 1989.
French Search Report dated Jun. 8, 1998 with annex on French Application No. 97–12066.

*Primary Examiner*—Josie Ballato
*Assistant Examiner*—Russell M. Kobert
*Attorney, Agent, or Firm*—Theodore E. Galanthay; Stephen Bongini; Fleit, Kain, Gibbons, Gutman & Bongini P.L.

[57] ABSTRACT

A semiconductor device includes first through fourth pads and first through third external connection leads, with the first external connection lead being a ground connection lead and the first and second pads being ground pads. First through fourth connection wires selectively connect the pads to the external connection leads. Additionally, a first ground line is connected to the first pad, a second ground line is connected to the second pad, a first protective diode connects the first ground line to the third pad, and a second protective diode connects the second ground line to the fourth pad. The first external connection lead is connected to the first pad via the first connection wire and to the second pad via the second connection wire, the third connection wire connects the third pad to the second external connection lead, and the fourth connection wire connects the fourth pad to the third external connection lead. In one preferred embodiment, the semiconductor device also includes first and second current generators and detectors coupled between the first and second pads and between the first and third pads, respectively. A comparator coupled to the first and second detectors outputs a signal whose level depends on the difference between the outputs of the two detectors.

5 Claims, 1 Drawing Sheet

SEMICONDUCTOR DEVICE HAVING TWO GROUND PADS CONNECTED TO A GROUND CONNECTION LEAD AND METHOD FOR TESTING THE SAME

This is a divisional of application Ser. No. 09/163,045, filed Sep. 29, 1998, now U.S. Pat. No. 5,986,345. The entire disclosure of prior application Ser. No. 09/163,045 is herein incorporated by reference.

CROSS-REFERENCE TO RELATED APPLICATIONS

This application is based upon and claims priority from prior French Patent Application No. 97-12066, filed Sep. 29, 1997, the entire disclosure of which is herein incorporated by reference.

FIELD OF THE INVENTION

The present invention relates to semiconductor devices, and more specifically to semiconductor devices having two ground pads connected to a ground connection lead and methods for testing the quality of such devices.

BACKGROUND OF THE INVENTION

Conventional semiconductor devices in the form of integrated circuit chips are provided with pads for selective connection to the components of the integrated circuit, and with external connection leads that are selectively connected to the connection pads on the chip by connection wires. This whole assembly is encapsulated in a resin in such a way that only the ends of the connection leads extend outside the package. After fabricating such a semiconductor device, it is typically tested before being sold. Generally, two types of tests are performed.

A first series of tests, which are known as conduction continuity tests, is used to determine if the connection wires are cut or in contact with one another (i.e., short-circuited), and to determine if the soldered joints used for connecting the connection wires to the pads and the connection leads have been suitably produced. Typically, the connection leads are selectively connected to a current source and current flow is tested. If current does not flow, the semiconductor device is rejected. A second series of tests is used to determine if the internal circuits of the chip are operating correctly. If correct circuit operation is not observed during this testing, the semiconductor device is rejected.

In some cases, an external connection lead that is a ground connection lead is connected to two pads, which act as two ground pads for the integrated circuit. These two ground pads can act as the ground for two functionally separate parts of the integrated circuit. In such a case, the conduction continuity tests described above cannot be used for the connection wires for the single ground connection lead, which is connected to two pads on the chip. Therefore, only during the second series of tests (i.e., the functional tests) can such a semiconductor device be rejected for malfunctioning wire connections. It would be economically advantageous to be able to reject such incorrectly fabricated semiconductor devices during the first series of tests (i.e., the conduction continuity tests).

SUMMARY OF THE INVENTION

In view of these drawbacks, it is an object of the present invention to remove the above-mentioned drawbacks and to provide a semiconductor device whose structure is particularly suitable for determining the quality of electrical connections between ground connection leads and ground pads through conduction continuity testing.

A preferred embodiment of the present invention provides a semiconductor device in the form of an integrated circuit chip having pads that are selectively connected to the components of the integrated circuit, and external connection leads that are selectively connected to the pads by connection wires. A first one of the external connection leads, which is a ground connection lead, is connected by connection wires to at least two of the pads so as to form first and second ground pads for the integrated circuit. The first and second ground pads are respectively connected to first and second ground lines of the integrated circuit, and the first and second ground lines are respectively connected to third and fourth pads via protective diodes. Further, the third and fourth pads are respectively connected to second and third external connection leads by connection wires. In one embodiment, the connections between the ground connection lead and the second external connection lead and between the ground connection lead and the third external connection lead have the same or similar geometrical and electrical characteristics.

The present invention also provides methods for testing such a semiconductor device. According to one preferred method, the ground connection lead and the external connection leads connected to the third and fourth pads are connected to two current sources. The voltage between the ground connection lead and the external connection lead connected to the third pad and the voltage between the ground connection lead and the external connection lead connected to the fourth pad are measured. The difference between these measured voltages is calculated and compared with a reference value in order to deliver a signal relating to the quality of the connections of the ground connection lead. In one embodiment, the voltage measurements are performed in a sequential fashion.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
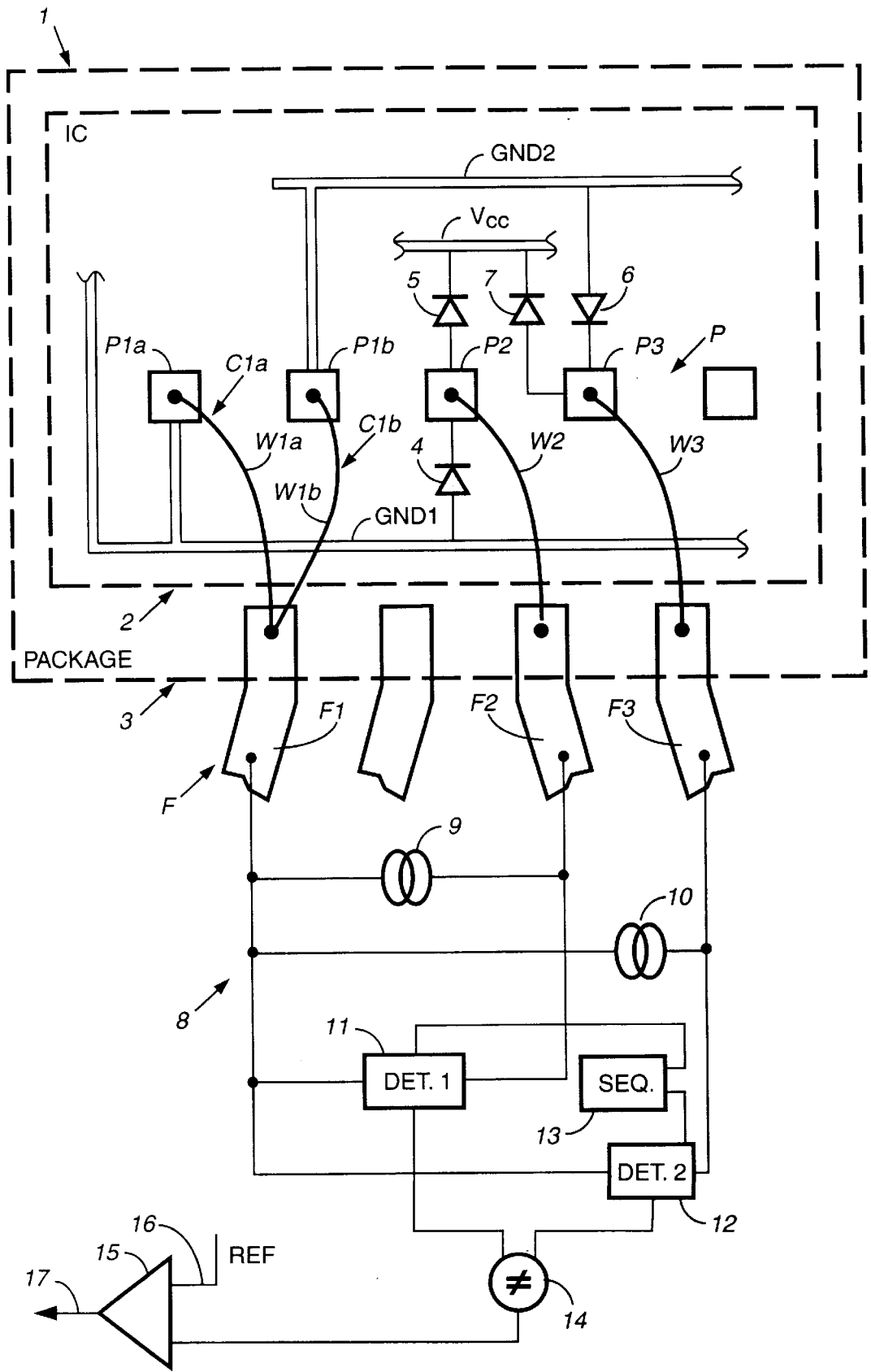
FIG. 1 shows essential portions of a semiconductor device according to a preferred embodiment of the present invention along with an associated testing apparatus.

Preferred embodiments of the present invention will be described in detail hereinbelow with reference to the attached drawing.

FIG. 1 shows a semiconductor device 1 that includes a chip 2 containing an integrated circuit. On the peripheral edge of one of the chip's faces, there are pads P that are selectively connected to the internal components of the integrated circuit. Additionally, external connection leads F are selectively connected to the pads P via metal connection wires W, the ends of which are selectively soldered to the pads P on the chip 2 and to the external connection leads F. This assembly is embedded or encapsulated in a resin or the like to form an integrated circuit package 3, and the ends of the connection leads F project from the periphery of the package to allow the chip 2 to be connected to other circuits (e.g., a printed circuit board).

In the exemplary device shown in FIG. 1, a ground connection lead F1 is connected to a ground pad P1a on the chip 2 via a metal connection wire W1a, and to another ground pad P1b via another metal connection wire W1b. Additionally, the pad P1a is connected to a first ground line GND1 of the integrated circuit, and the pad P1b is connected to a second ground line GND2 of the integrated circuit. The first ground line GND1 and the second ground line GND2 form the grounds for two functionally separate integrated parts of the chip 2. In particular, the second ground line GND2 is used for an "unpolluted" part of the integrated circuit.

Additionally, external connection leads F2 and F3 are respectively connected to pads P2 and P3 via metal connection wires W2 and W3, respectively. The pad P2 is connected to the ground line GND1 and to a supply line Vcc via protective diodes 4 and 5, respectively. Similarly, the pad P3 is connected to the ground line GND2 and to the supply line Vcc via protective diodes 6 and 7, respectively. In this manner, the integrated components in the chip 2 are protected from electrostatic discharges (ESD). Notably, the pads P2 and P3 are not directly connected through the integrated circuit in the chip 2.

The semiconductor device 1 described above is constructed so as to provide external connections for the various integrated components in the chip 2 and to protect such components. Additionally, it is constructed so as to allow testing of the quality of the connections of the ground connection wires W1a and W1b using conduction continuity tests, which are performed before the operational testing of the integrated circuit. As shown, the conduction testing is accomplished through a test apparatus 8 that tests the ground connections of the chip 2. The test apparatus 8 includes a first current generator 9 that is connected between external connection leads F1 and F2 and a second current generator 10 that is connected between external connection leads F1 and F3.

The test apparatus 8 also includes a first detector 11 that detects the voltage between external connection leads F1 and F2 and a second detector 12 that detects the voltage between external connection leads F1 and F3. The two detectors 11 and 12 are connected to a sequencer 13 and can store measured voltages under the control of the sequencer. Additionally, the test apparatus 8 has a subtractor 14 that calculates the difference between the voltage values stored in the two detectors 11 and 12, and a comparator 15 that compares this difference with a reference value 16. In accordance with the result of this comparison, the output 17 of the comparator is either a validation signal or rejection signal.

In other words, a first conduction chain C1a, which consists of external connection lead F1, connection wire W1a, pad P1a, ground line GND1, protective diode 4, pad P2, connection wire W2, and external connection lead F2, is connected to current generator 9 and voltage detector 11. Similarly, a second conduction chain C1b, which consists of external connection lead F1, connection wire W1b, pad P1b, ground line GND2, protective diode 6, pad P3, connection wire W3, and external connection lead F3, is connected to current generator 10 and voltage detector 12.

The preferred testing method for the semiconductor device of FIG. 1 will now be described. First, tests for checking the presence and operation of protective diodes 4 and 6 in the integrated circuit must be performed. In particular, protective diode 4 can be tested by connecting external connection leads F1 and F2 to a small current source (e.g., 1–10 mA) and measuring the voltage between these leads. If the measured voltage is greater than a predetermined value (e.g., 0.5–1.0 V), the diode 4 is present and operating properly. Protective diode 6 can be tested in a similar manner using external connection leads F1 and F3.

While these tests detect the presence of protective diodes 4 and 6, they can give positive results when only one of the ground connection wires W1a and W1b is present. This is because even if a connection between ground connection lead F1 and one of the ground pads P1a or P1b is absent, the proper voltage may appear between ground connection lead F1 and the ground pad due to current flow between the ground pads P1a and P1b via the substrate of the chip 2. Therefore, testing of the connection between the ground connection lead and the ground pads must be performed using the test apparatus 8. During this testing, current generators 9 and 10 deliver currents having values markedly higher than the currents used for carrying out the diode tests described above. In preferred methods, the current generators 9 and 10 each deliver a current of 20–40 mA.

Under the control of the sequencer 13, the first current generator 9 and the first voltage detector 11 are activated, the voltage between external connection leads F1 and F2 is stored, and then these devices are deactivated. Then, the second current generator 10 and the second voltage detector 12 are activated, the voltage between external connection leads F1 and F3 is stored, and then these devices are deactivated. The subtractor 14 calculates the difference between the measured voltages and delivers this difference to the comparator 15.

If the first conduction chain C1a and the second conduction chain C1b are both correctly fabricated, the subtractor 14 provides the comparator 15 with a signal that is smaller than a predetermined reference signal 16 (e.g., 0.2–0.4 V). In such a case, the comparator 15 generates an output signal 17 for validating the semiconductor device 1. On the other hand, if one of the ground connection wires W1a and W1b is cut or short-circuited with another connection wire, or if the soldered joints of these wires are poor or non-existent, or if one of the ground lines GND1 or GND2 is interrupted, the difference generated by the subtractor 14 will be substantially greater than the reference value 16. In this case, the comparator 15 generates an output signal 17 for rejecting the semiconductor device 1.

As explained above, in the event of a failure in the connection between external connection lead F1 and pad P1a (via connection wire W1a), or of a break in ground line GND1, or in the event of a failure in the connection between external connection lead F1 and pad P1b (via connection wire W1b), or of a break in ground line GND2, a current flow may exist between external connection leads F2 and F3 or between external connection leads F1 and F2 due to the resistivity of the substrate of the chip 2. Thus, a parallel current flow may be detected by the test apparatus 8. Thus, the reference value 16 used by the comparator 15 must be chosen so as to take into account such a parallel current. That is, the reference value must be high enough that the difference between the measured voltages is below the reference value when only the parallel current flow is present. (The effects of the parallel current flow are attenuated in semiconductor devices in which the integrated components connected to ground line GND2 are in an isolated well that is integrated into the chip 2.) Moreover, in preferred embodiments, the connections between pads P1a and P2

(via ground line GND1 and protective diode 4) and between pads P1*b* and P3 (via ground line GND2 and protective diode 6) have the same (or very similar) geometrical and electrical characteristics. This makes the conduction chains C1*a* and C1*b* electrically identical (or very similar) so that the choice of the reference value 16 and the above-described testing is easier. More specifically, such matching allows the two current generators 9 and 10 to deliver identical (or very similar) currents. In the preferred testing method, if the conduction chains C1*a* and C1*b* are both operating properly, the voltages measured by the two voltage detectors 11 and 12 are about 0.5–1.0 V.

In the embodiments described above, two ground pads are connected to a ground connection lead. However, in further embodiments, three or more ground pads are selectively connected to one or more ground connection leads. Likewise, the testing apparatus and method described above represent only one specific embodiment of the present invention. Other testing equipment and methods could be used in accordance with the teachings of the present invention. Furthermore, embodiments of the present invention may not include all of the features described above.

While there has been illustrated and described what are presently considered to be the preferred embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A method for testing a semiconductor device, the semiconductor device including:

first, second, third, and fourth pads selectively connected to components of the integrated circuit, the first and second pads being ground pads for coupling to a ground potential;

first, second, and third external connection leads, the first external connection lead being a ground connection lead for coupling to a ground potential;

first, second, third, and fourth connection wires that selectively connect the pads to the external connection leads;

a first ground line connected to the first pad;

a second ground line connected to the second pad;

a first protective diode that connects the first ground line to the third pad; and a second protective diode that connects the second ground line to the fourth pad, wherein the first external connection lead is connected to the first pad via the first connection wire and to the second pad via the second connection wire, the third connection wire connects the third pad to the second external connection lead, and the fourth connection wire connects the fourth pad to the third external connection lead, said method comprising the steps of:

connecting the first external connection lead and the second external connection lead to a first current source;

connecting the first external connection lead and the third external connection lead to a second current source;

measuring a first voltage that exists between the first external connection lead and the second external connection lead;

measuring a second voltage that exists between the first external connection lead and the third external connection lead; and comparing the first and second measured voltages.

2. The method as defined in claim 1, wherein the comparing step includes the sub-steps of:

calculating the difference between the first and second measured voltages; and comparing the calculated difference with a reference value.

3. The method as defined in claim 2, wherein the comparing step further includes the sub-step of generating a signal whose level is dependent on the result of the comparing sub-step, the signal relating to the quality of the connections between the first external connection lead and the first and second pads.

4. The method as defined in claim 1, wherein the measuring steps are performed sequentially.

5. The method as defined in claim 1, wherein the measuring steps are performed simultaneously.

* * * * *